United States Patent [19]

Lentz et al.

[11] Patent Number: 4,816,634
[45] Date of Patent: Mar. 28, 1989

[54] METHOD AND APPARATUS FOR MEASURING STRONG MICROWAVE ELECTRIC FIELD STRENGTHS

[76] Inventors: Ronald R. Lentz, 3230 Everest La., Plymouth, Minn. 55447; Dan J. Wendt, 6994 W. Shadow Lake Dr., Lino Lakes, Minn. 55042; Jonathon D. Kemske, 1417 Mississippi St., New Brighton, Minn. 55112; Peter S. Pesheck, 3125 62nd Ave. N., Brooklyn Center, Minn. 55429

[21] Appl. No.: 113,128

[22] Filed: Oct. 23, 1987

[51] Int. Cl.$^4$ ................................................ H05B 6/80
[52] U.S. Cl. ....................... 219/10.55 M; 219/10.55 B; 219/10.55 E; 374/119; 324/58 C; 426/107; 426/234
[58] Field of Search ................ 219/10.55 B, 10.55 E, 219/10.55 F, 10.55 M; 374/110, 112, 141, 149, 204; 324/58 R, 58 C, 144, 451, 457, 95; 426/107, 113, 241, 243, 234, 451; 99/DIG. 14

[56] References Cited

U.S. PATENT DOCUMENTS 4,009,359  2/1977  Tallmadge et al. .......... 219/10.55 B
4,210,795  7/1980  Lentz ............................ 219/10.55 B Primary Examiner—Philip H. Leung
Attorney, Agent, or Firm—Arnold, White & Durkee

[57] ABSTRACT

A method and apparatus for measuring strong microwave electric field strengths is disclosed. The apparatus includes a first active temperature probe in cooperation with susceptor means for measuring a temperature indicative of the heating effects of microwave radiation at a test location, and an ambient temperature probe for measuring ambient temperature. The temperature differential between the two probes is used by calibration means for determining electric field strength at the test location. The method includes the steps of heating a susceptor means with microwave radiation, and measuring a temperature indicative of the heating effects of microwave radiation at the test location. Ambient temperature is measured, and the temperature differential used to determine the magnitude of the electric field strength.

5 Claims, 9 Drawing Sheets

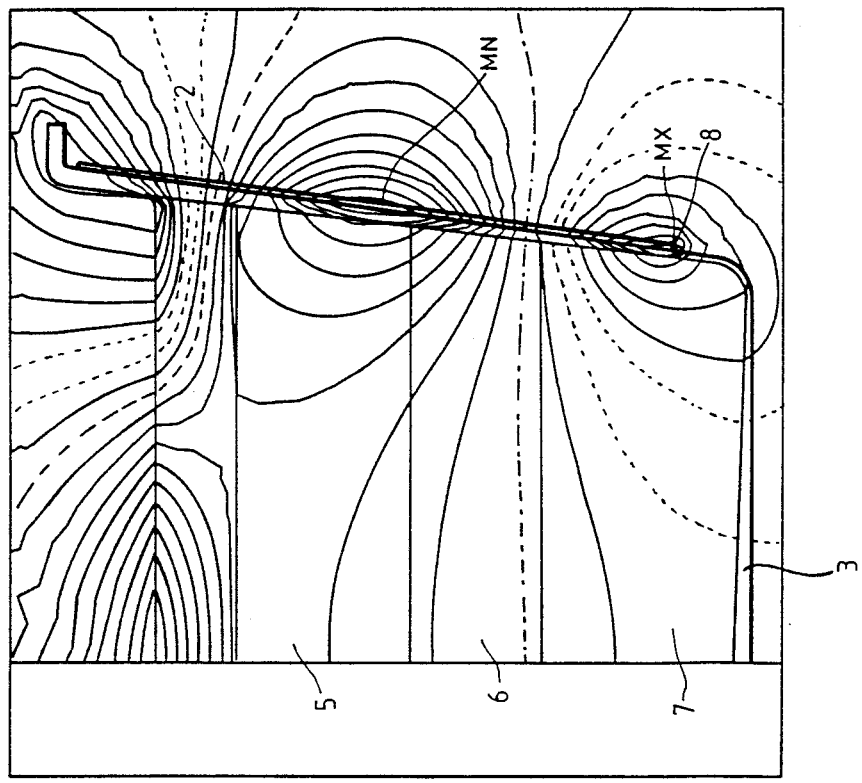

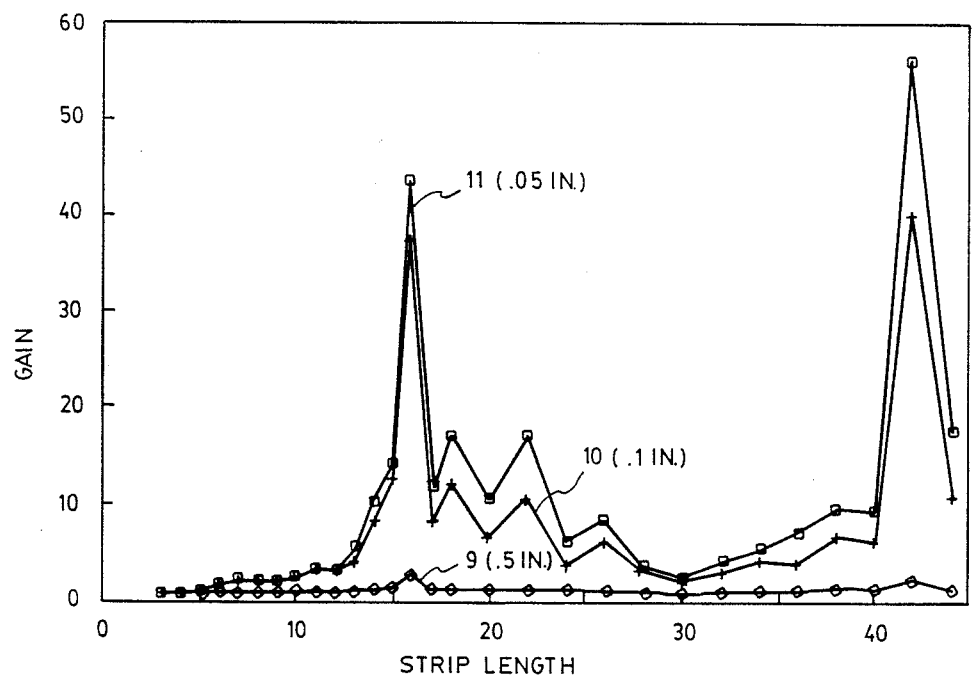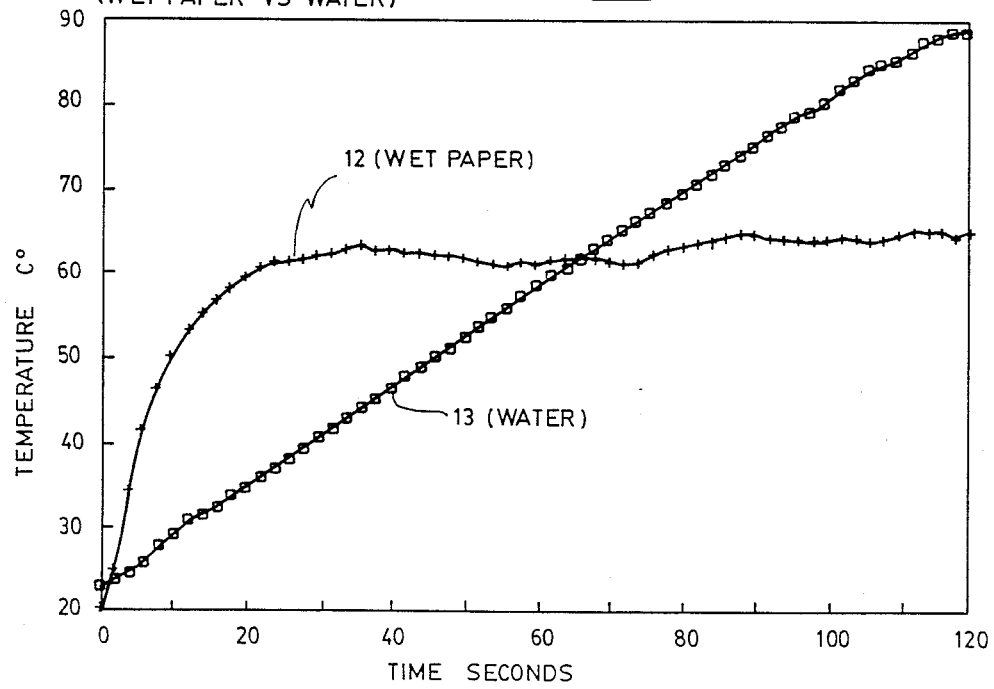

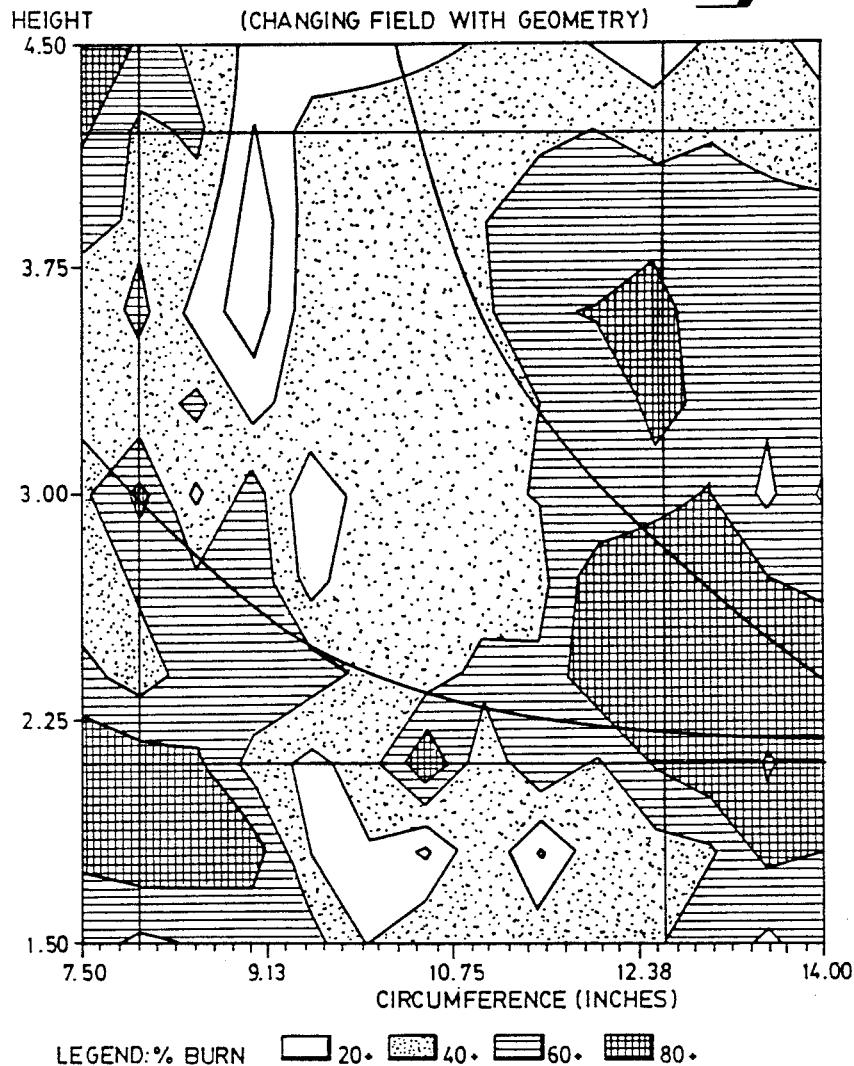

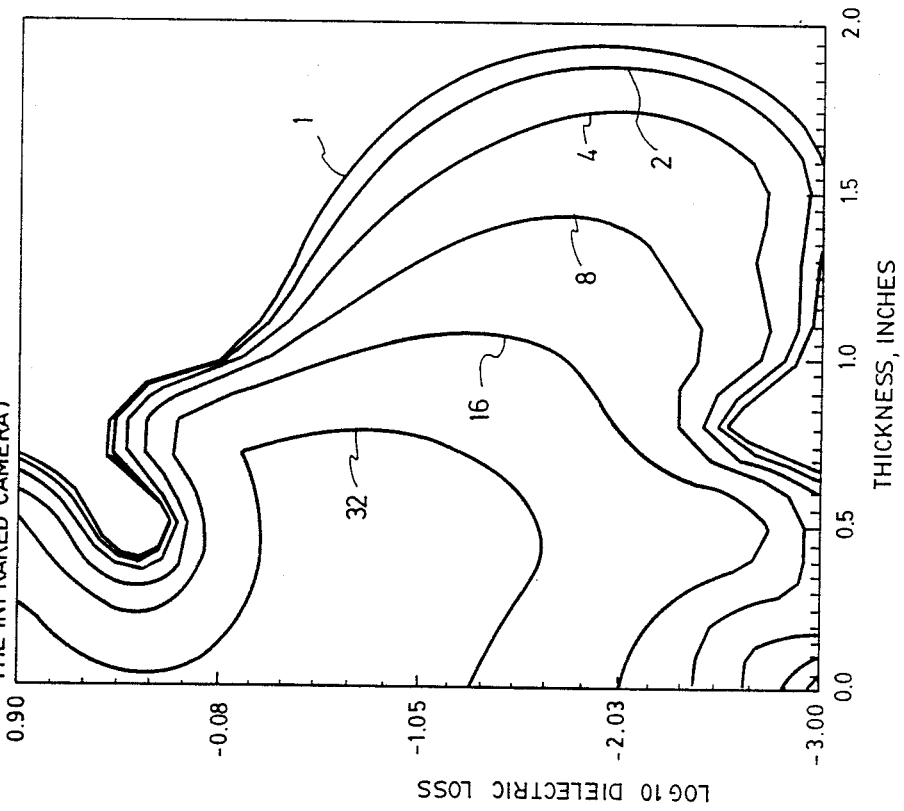
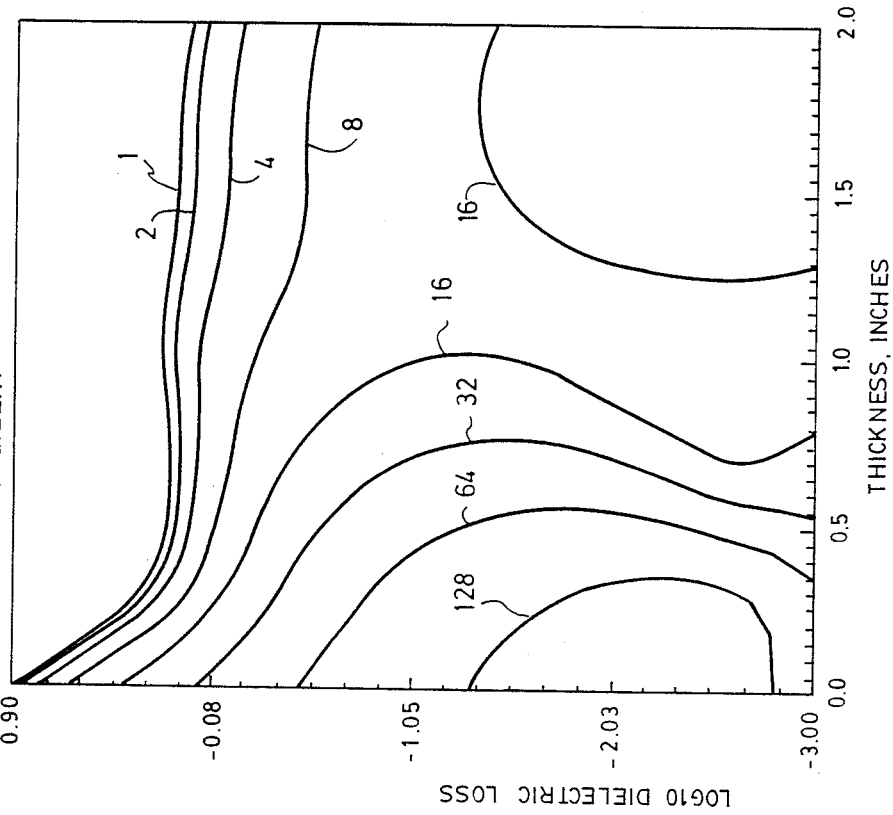

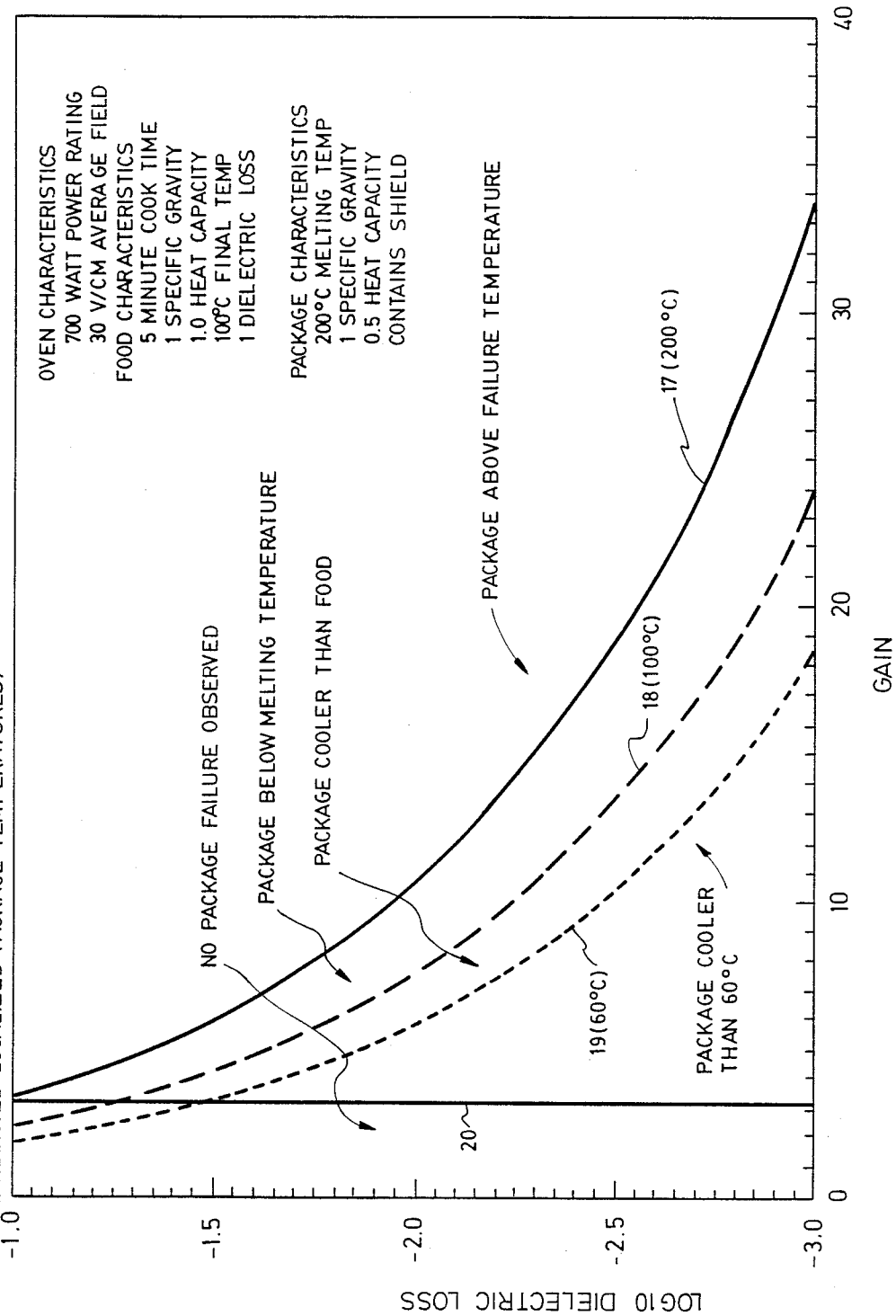

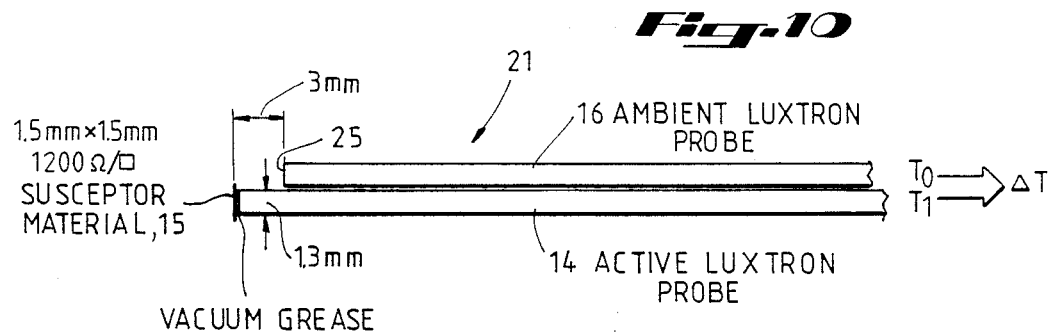
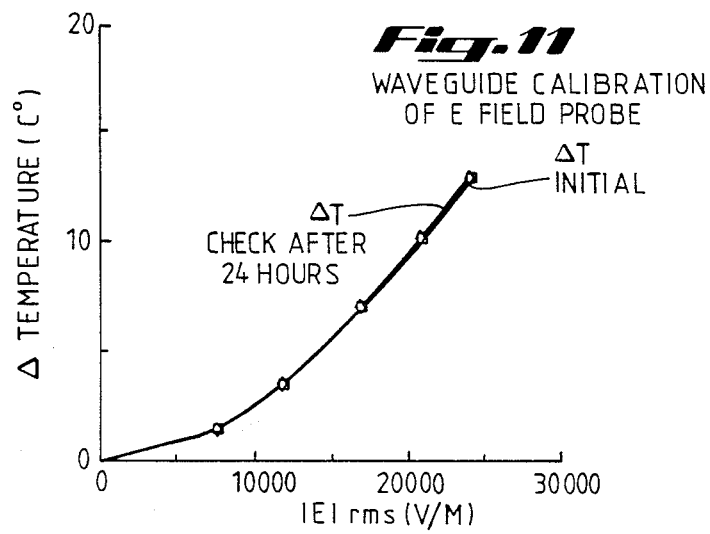
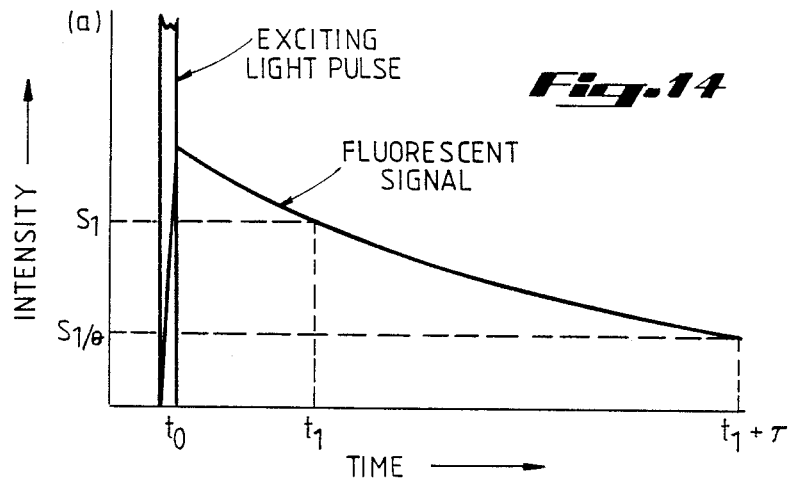

METHOD AND APPARATUS FOR MEASURING STRONG MICROWAVE ELECTRIC FIELD STRENGTHS

CROSS-REFERENCE TO RELATED APPLICATIONS

This application discloses subject matter related to application Ser. No. 113,171, filed Oct. 23, 1987, by Dan J. Wendt, entitled "Packaging Materials for Shielded Food Containers Used in Microwave Ovens", the entire disclosure of which is incorporated herein by reference. This application is also related to application Ser. No. 922,287, filed Oct. 23, 1986, by Dan J. Wendt, entitled "Food Container and Method for Manufacture", the entire disclosure of which is incorporated herein by reference.

BACKGROUND OF THE INVENTION

In the past, it has been possible to measure electric field strengths directly in relatively weak electric fields. Various techniques, such as diodes, have been used to detect microwave electric fields, and to produce a signal indicative of the strength of the electric field. However, presently available diodes do not survive well in strong microwave electric fields, and have been unsuitable for use in such environments. To increase a diode's power handling capability would probably involve increasing the junction area of the semiconductor to the point that the junction capacitance would be too large for effective operation at microwave frequencies.

The need has existed to directly measure strong microwave electric fields, for example in microwave ovens.

Diodes also suffer from a lack of precise spatial readings. Because of the relatively large physical size of a diode, it is virtually impossible to obtain a precise reading of the electric field strength at a particular point. Instead, the output of the diode is generally an average of the electric field strength over the area encompassed by the physical size of the diode. Metal shielded packages for use in a microwave oven may have rapidly diminishing field strengths as one moves away from the metal surface. A probe which is not capable of measuring electric field strengths at a particularly small point will not give accurate measurements under such circumstances.

A need has existed for a probe capable of measuring the electric field strength at a particular small region or point, or on a particular localized surface in a microwave oven.

The electric field is affected by metallic probes and other metallic elements which might be introduced into the oven in order to measure the field. Many available metallic probes change the very field that one is attempting to measure. Thus, the measurement fails to accurately measure the electric field strength, but instead measures the disturbed field strength, which may be significantly different. It is desirable to accurately measure the electric field while disturbing it as little as possible.

The need has also existed for a probe capable of measuring electric field strength in a microwave oven without substantially perturbing the field.

Recent advances in the use of shielded packages and other containers containing metal components in a microwave oven have increased the need for a technique to measure electric field strength in a strong microwave field. Such measurements are necessary for purposes of determining suitable materials for the packaging which is used in a microwave oven, for understanding the function of metal packaging components, for studying problems of arcing, resonance and regenerated fields in a microwave oven, and for other purposes.

Therefore, the need has existed for an apparatus and method capable of measuring strong microwave electric fields without substantially perturbing the field that is being measured.

SUMMARY OF THE INVENTION

The present invention relates to a method and apparatus for measuring strong microwave electric field strengths.

The method includes the steps of measuring a temperature indicative of the heating effects of microwave radiation at a location where the electric field strength is desired to be determined. Then the ambient temperature at a second location remote from the first location is measured. A temperature differential representative of the difference between the first temperature and the ambient temperature is determined. The relationship between the temperature differential and electric field strength is calibrated by measuring the magnitude of the temperature differential produced by a known electric field. Then the electric field strength at the measured location is determined based upon the magnitude of the temperature differential.

An apparatus in accordance with the present invention includes a first temperature probe for measuring a temperature indicative of the heating effects of microwave radiation. A second temperature probe located remote from the first probe is used for measuring an ambient temperature. Means for determining a temperature differential representative of the difference between the first temperature and the ambient temperature connected to the first and second temperature probes generates an output which can be related to electric field strengths using suitable calibration means. Susceptor means is used to obtain a temperature indicative of the heating effects of microwave radiation.

BRIEF DESCRIPTION OF THE DRAWINGS

FIG. 3 is a computer generated graph illustrating the electrical field around a shielded container.

FIG. 4 is a graph depicting the gain in electrical field strength for various lengths of metal foil and at various distances from the metal foil.

FIG. 5 is a graph illustrating field strength for a cylindrical shield as a function of the geometry of the shield.

FIG. 6 is a graph depicting the heating effects of microwave radiation upon wet paper as compared with water.

FIG. 7 is a graph depicting contour plots showing voltage gain as a function of thickness and dielectric properties.

FIG. 8 is a graph depicting contour plots showing temperature gains as a function of thickness and dielectric properties.

FIG. 9 is a graph depicting performance of an idealized food and package combination.

FIG. 10 is a side view of a probe used to measure electrical field strength.

FIG. 11 is a graph depicting a calibration curve for the probe of FIG. 10.

FIG. 14 is a graph illustrating the intensity of the fluorescence signal as a function of time.

DETAILED DESCRIPTION OF A PREFERRED EMBODIMENT

Figure 1:
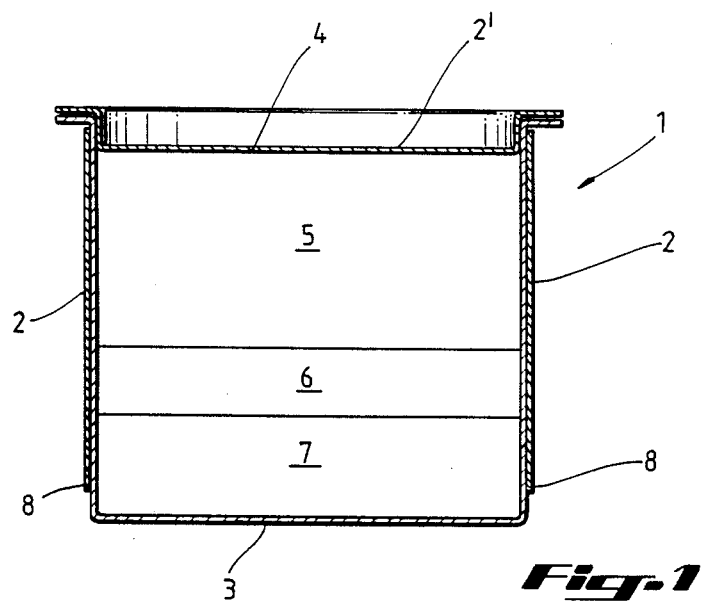
FIG. 1 is a cut-away side view of a package employing a metal shield.

A procedure or method has been developed for measuring a value for Erms to be used in design calculations for designing microwave package materials. The preferred procedure uses a Luxtron Fluoroptic thermometry system. This system is preferred because it is a non-field-perturbing method of measurement in a microwave electrical field. Two probes are set up as shown in FIG. 10 to form a probe assembly 21.

In the illustrated example, an active Luxtron temperature probe 14 is constructed having a square piece of susceptor material 15 attached to the end thereof. The susceptor 15 is preferably made from a 1.5 mm × 1.5 mm square of susceptor material having a resistivity of about 1200 ohms per square. The susceptor 15 preferably comprises a sheet of metallized polymer. In the illustrated example, a thin film of stainless steel was sputtered on a sheet of 92 gauge polyester material. It is preferred that the sheet of metallized polyester not be bonded to a sheet of paper or other material, in order to minimize the effect upon thermal mass which such a sheet of paper or other material would have. The susceptor 15 is preferably attached to the probe 14 with vacuum grease, or other suitable adhesive.

A second ambient Luxtron temperature probe 16 is attached to the active Luxtron probe 14, or may be disposed in close proximity thereto. The second ambient probe 16 measures ambient air temperature near the active probe 14. In a preferred embodiment, the ambient Luxtron probe is spaced 3 millimeters from the end of the active Luxtron probe having the susceptor 15 attached thereto. The illustrated Luxtron probes 14 and 16 have a diameter of 1.3 millimeters.

First, the probe assembly 21 is calibrated. The calibration procedure preferably uses an adjustable microwave power source having a known or measurable power output. This may be used in conjunction with a wave guide having known characteristics. In the illustrated example, a Gerling Moore high power microwave source, sold under the trademark of "Genisys", is used in conjunction with a rectangular WR-284 wave guide.

Using the microwave power source, a known power input is placed into the wave guide. The electric field strength Erms can be calculated based upon the following formula:

$$p = Erms^2 \frac{abk'}{2k\rho_0}$$

where P is the known power transmitted into the wave guide, expressed in watts; a is the width of the wave guide, in this example 0.0721 meters; b is the height of the wave guide, in this example 0.034 meters; $\lambda_0$ is the wavelength of the microwaves, in this example 0.124 meters; k is equal to $2\pi$ divided by $\lambda_0$; $\rho_0$ is the impedance of free space, in this example 376.7 ohms; Erms is the electrical field strength expressed in volts per meter; k' is the wave number of the wave guide, in this example it is equal to:

$$k' = \sqrt{\left(\frac{2\pi}{\lambda_0}\right)^2 - \left(\frac{\pi}{a}\right)^2}$$

Using this particular wave guide for the calibration procedure, the above expression can be simplified as follows:

$$\text{Erms} = 762\sqrt{P}$$

where P is the power in watts transmitted into the wave guide by the microwave power source, and Erms is the electrical field strength expressed in volts per meter.

The Luxtron probe assembly 21 illustrated in FIG. 10 is placed in the wave guide described above for calibration. A known microwave power level is then transmitted into the wave guide. The active Luxtron probe 14 is allowed to reach a steady state temperature. This usually occurs within seconds. Thus, a steady state temperature differential may be measured between the active Luxtron probe 14 and the ambient Luxtron probe 16. This temperature differential may be measured for several power settings. The temperature differential, expressed as $\Delta T$, may be plotted versus Erms on a graph. Such a calibration plot of $\Delta T$ versus electric field strength Erms is shown in FIG. 11.

Once the Luxtron probe assembly 21 has been calibrated, the probe assembly 21 may be inserted into a microwave oven to measure the actual electrical field strength in the oven. The calibration curve shown in FIG. 11 is used to determine the electrical field strength Erms at the measured point. The composite Luxtron probe assembly 21 may be advantageously used to measure electrical field strength Erms adjacent a metal shield 2 on a microwave container 3.

The active Luxtron probe 14 shown in FIG. 10 is sensitive to electric fields in the plane of the susceptor 15. This particular probe has a minimal response to electric fields which are perpendicular to the plane of the susceptor 15. Thus, measurements may be affected by the orientation of the susceptor 15. Multiple measurements using different probe orientations may be taken to determine an average electrical field strength. In some cases, for example where a shield 2 is responsive to microwave energy having a particular polarization, the probe 14 may offer the advantage of measuring only the electrical field strength of interest.

In the illustrated example, Luxtron model MIC-02-10093 probes 14 and 16 were used. The probes 14 and 16 are connected to a Luxtron Fluoroptic thermometry system, Model No. 750.

Figure 12:
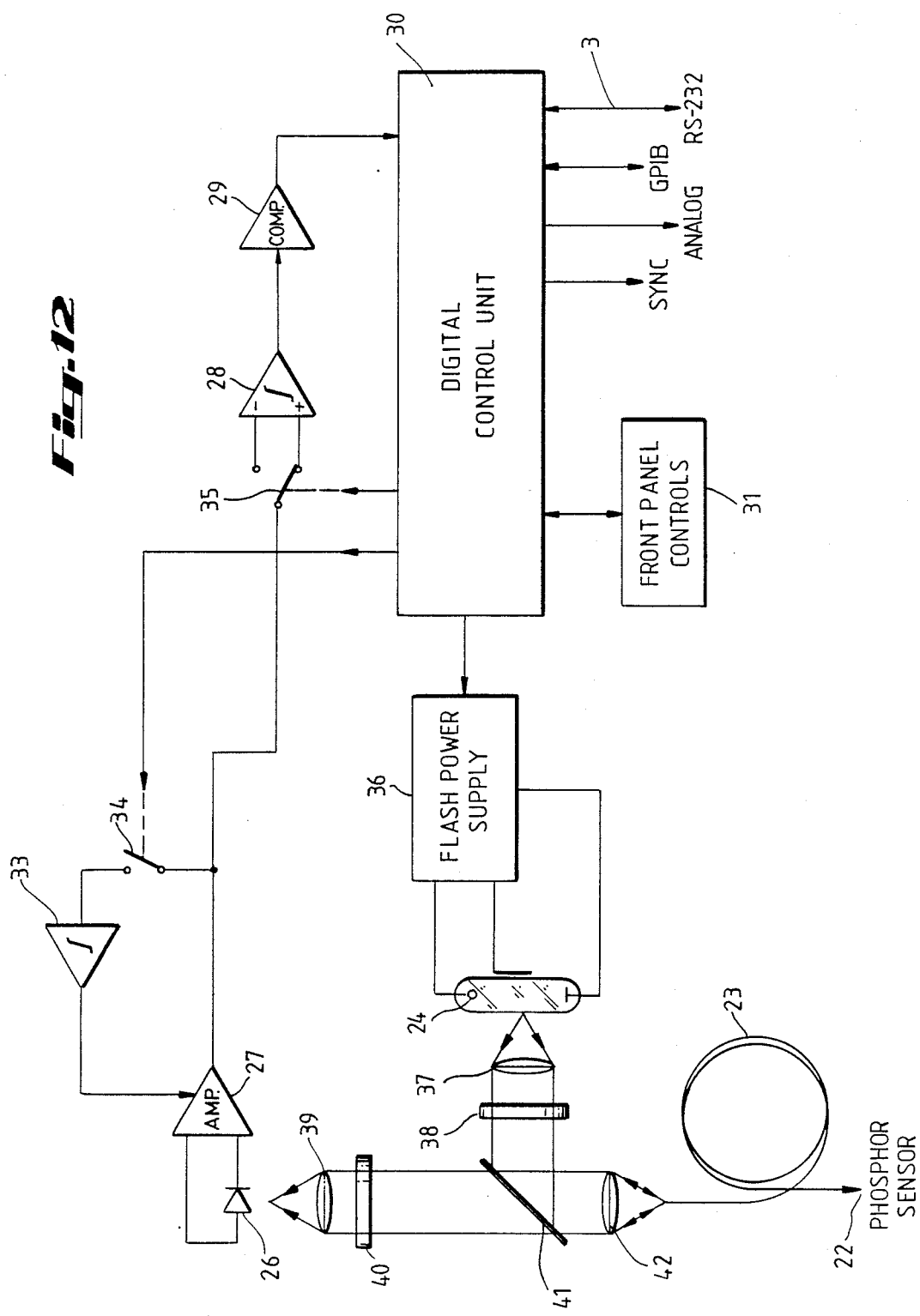
FIG. 12 is a block diagram illustrating the circuit of the Luxtron Fluoroptic thermometry system.

The Luxtron Fluoroptic thermometry system may be best understood in connection with FIG. 12.

A probe or sensor 22 is connected to a fiberoptic cable 23. The sensor 22 is identical to the Luxtron probes 14 and 16 shown in FIG. 10. Blue violet light from a Xenon flash lamp 24 is transmitted down the fiberoptic cable 23 to the probe 22. A phosphor 25 located at the tip of each probe 14 and 16 will fluoresce, as will be explained more fully hereafter. A red fluorescence will return to a photodiode detector 26 the photodiode current as amplified by an amplifier 27. The output of the amplifier is coupled to an integrator 28. The output from the integrator 28 is fed into a comparator 29 which is used to detect a zero crossing of the signal. A digital control unit 39 generates control signals to sequence the flash from the flash lamp 24, and controls the timing for detection of the comparator 29 output signal. The digital control unit 30 also provides outputs indicative of the temperature measurement, which is displayed on a front panel 31. The digital control unit is also capable of communicating directly with a computer using an RS-232 link 32. The digital conversion unit uses a stored conversion table to convert the measured signal into a temperature indication.

An offset integrator 33 is used to integrate out any signal which may be present during periods when there is no fluorescence. This is used to maintain the offset for the amplifier 27 at a zero level. The offset integrator is controlled by a switch 34. The integrator 28 can be used for both integration and de-integration. This function is controlled by a switch 35. The digital control unit 30 controls the switches 34 and 35.

A flash power supply 36 is provided. A lens 37 and blue filter 38 are used in conjunction with the flash lamp 24. A lens 39 and red filter 40 are used in conjunction with the photodiode 26. A dichroic mirror 41 is used to split the light going into and out of the fiberoptic cable 23 between the flash lamp 24 and the photodiode 26. A lens 42 is used for coupling with the fiberoptic cable 23.

Figure 13:
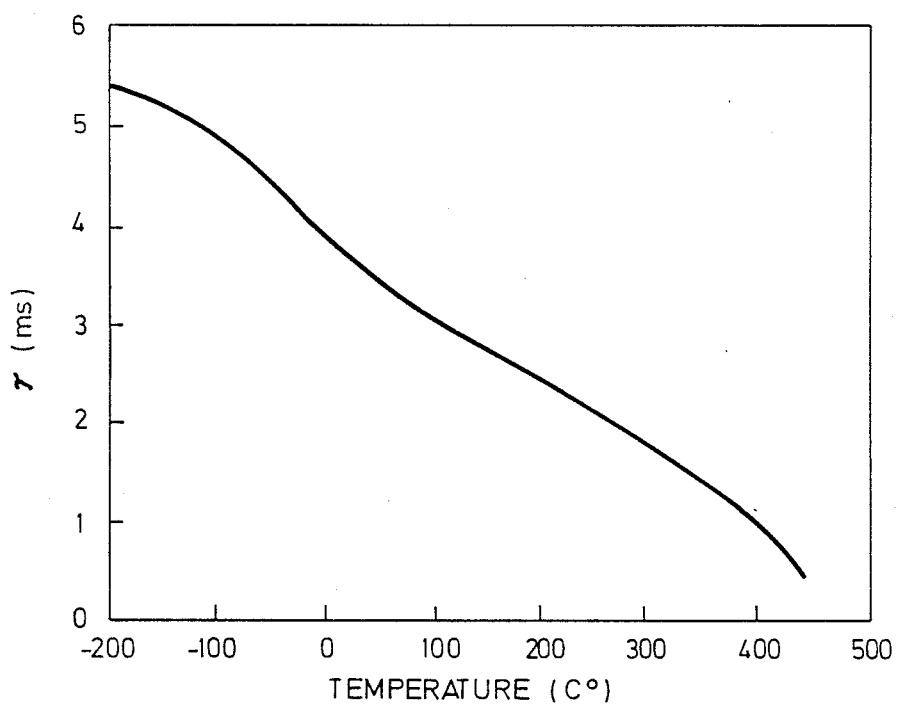
FIG. 13 is a graph depicting the relationship between delay time and temperature of phosphor used on the probe of FIG. 10.

Each probe 14 and 16, (and sensor 22), uses a phosphor 26 at the tip of the probe. The phosphor 25 is magnesium fluorogermanate activated with tetravalent manganese. When the phosphor 25 is excited with blue violet light emitted by the flash lamp 24, it will fluoresce in a deep red. The red fluorescence decays according to a curve shown in FIG. 13. The decay time is a function of temperature. Measurement of the decay time can then be calibrated to indicate the phosphor temperature. The exponential decay of the fluorescence of the phosphor 25 after the cessation of the flash of light emitted by the flash lamp 24 is measured by determining the time for the signal detected by the photodiode 26 to decrease to 1/e of its initial value.

The fiberoptic cable 23 is preferably coated with black teflon. This avoids the entry of ambient light into the fiberoptic cable 23, which might affect the accuracy of the measurements.

Figure 13A:
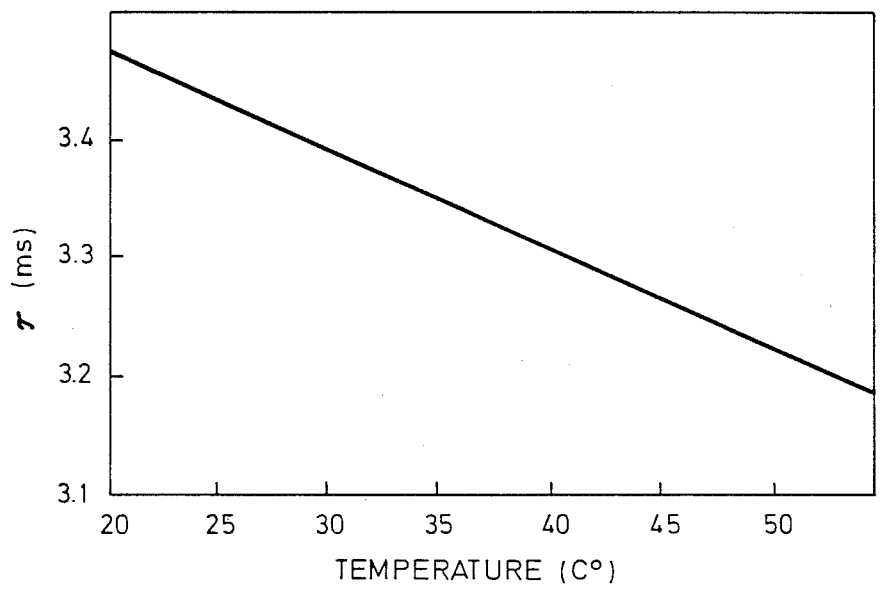
FIG. 13A is a graph showing a more detailed view of the relationship between delay time and temperature.

The decay time determination is basically a two point measurement. This may be better understood with reference to FIG. 14. An initial reading of the optical signal level, indicated as $S_1$ in FIG. 14, is taken at one millisecond after the cessation of the exciting light pulse from the flash lamp 24. The point in time when the light flash ceases is indicated as time $t_0$ in FIG. 14. The point in time at which the initial reading is taken is indicated as time $t_1$ in FIG. 14. The digital control unit then determines a reference signal level equal to $S_1/e$. The digital control unit 30 then times the amount of time, indicated in FIG. 14 as $t_1+\tau$, for the decaying signal to diminish to the reference level $S_1/e$. The decay time $\tau$ may thus be measured. A graph of the decay time $\tau$ versus the temperature T is shown as FIG. 13A. Thus, a measurement of the temperature sensed by the probe 22 may be determined by measuring the decay time $\tau$ of the phosphor 25.

An application of the present invention may be better understood by considering the discussion below. FIG. 1 shows a cut-away view of a microwave food package 1 employing a metal shield 2 wrapped around a dielectric support, member or container 3. In the illustrated example, the package 1 includes a removable top 4 that is also covered by a metal shield 2'.

Figure 2:
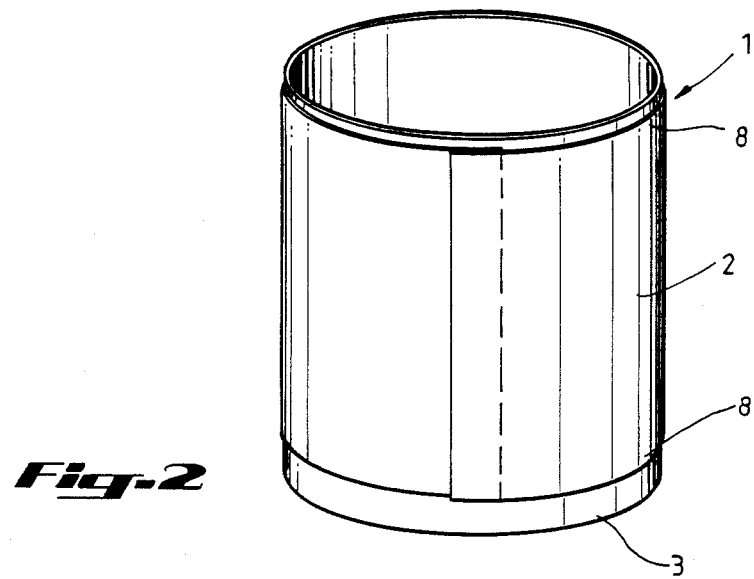
FIG. 2 is a perspective view of an empty cylindrical container having a shield.

FIG. 2 is a perspective view of the container 3 with the shield 2 wrapped around it in the form of a foil label 2.

In the particular example shown in FIG. 1, three layers of food substances are contained in the container 3. The food substances include an ice cream layer 5, a sauce layer 6, and a baked good layer 7. The baked good layer 7 may be a brownie layer 7. In this example, the metal shielding 2 and 2' forms a shielded zone in the container 3 which keeps the ice cream 5 frozen while the baked good 7 is heated by microwave radiation.

The use of metal shielding 2, or a conductive sheet 2, around the container 3 has resulted in unexpected problems during microwave heating. It has been discovered that the metal foil 2 creates regenerated electrical fields, particularly concentrated around the edge 8 of the metal foil 2, that intensify the electrical field strength during microwave heating. This intensification can be as great as 50 times the average field strength where metal shielding is not used. In the intense fields which may occur when metal shielding 2 is employed around a food container 3 during microwave heating, some packaging materials used for the container 3 which normally have insignificant microwave absorption have been observed to melt or decompose in a matter of seconds.

FIG. 3 illustrates a computer generated graph of electrical field lines which may result during microwave heating. As shown in FIG. 3, the maximum electrical field strength tends to occur near the edge 8 of the shield 2. In studying the failure of dielectric materials near the edge 8 of the shield 2, it is desirable to be able to measure the electric field strength near the edge 8 of the shield 2.

When a dielectric support or container 3 is placed in close proximity to the metal shield 2, the effect of the increase in electrical field is most pronounced immediately next to the metal field 2. This is shown by the graph of FIG. 4.

FIG. 4 represents the results of an experiment where strips of aluminum foil taped to paper where exposed to microwave energy. The heating rate of the paper was measured at the foil edge (i.e., 0.05 inch), 0.1 inch from the foil, and 0.5 inch from the foil. This was then compared to the heating rate of paper without any foil. Temperatures were measured with a Luxtron probe taped to the paper. The ratio of temperature with the metal strip versus temperature without the metal strip is expressed as "gain" in FIG. 4.

As the graph of FIG. 4 shows, the amount of gain is virtually negligible at distances greater than ½ inch from the edge of the metal foil 2. At distances where the dielectric material of the support 3 is within 0.5 inch of the edge of the metal foil 2, the gain in electrical field strength can be quite high, especially where the length of the metal shield 2 approaches resonance. Thus, it is desirable to be able to measure the electric field strength very close to metal foil components of packages.

In FIG. 4, curve 9 represents the gain as a function of the length of a metal strip of foil at a distance of 0.5 inch from the edge of the foil. Curve 10 represents the gain at a distance of 0.1 inch from the edge of the metal foil strip. At this distance, the effect of gain upon a dielectric packaging material becomes appreciable, and the present application is particularly applicable. Curve 11 represents the gain at a distance of 0.05 inch from the edge of the metal foil strip. Thus, it can be concluded that the metal shields 2 and 2' will have the greatest effect upon the dielectric material of the container 3 and top 4 that is less than about 0.5 inch from the metal shield 2 and 2'. The metal shields 2 and 2' have a greater effect upon the dielectric material of the support 3 and top 4 when the metal shields 2 and 2', respectively, have a resonant length. At resonance, the strength of the electric field around the edges 8 of the metal shield 2 increases dramatically.

FIG. 5 is a graph illustrating the results of experiments upon a variety of cylindrically shaped paper containers 3 having shields 2 wrapped around the containers 3. When the shielded containers 3 were exposed to microwave radiation, the retransmitted fields around the shield 2 caused heating in the dielectric papers. The cylinders 3 were tested for hot spots by coating the package with cellulose acetate. The particular cellulose acetate compound employed turned dark at 290° F. Thus, the cellulose acetate gave an indication of the extent to which the paper was being heated. The graph of FIG. 5 illustrates the amount of blackening that occurred over the aluminum foil shielded cylinder 3, as observed by the reaction of the acetate material to the heating of the paper. This experiment provides further information showing the effects of resonance and gain in electrical fields which may occur when metal shielding 2 is used in a package 1.

Therefore, in containers 3 employing metal foil shielding 2, it is necessary to select a dielectric material composition for the container 3 which has a combination of characteristics such that the container 3 can withstand the electrical fields which may exist around the edges 8 of the shield 2. The selection of a suitable material is facilitated by the ability to measure the electrical fields.

In a shielded container 3, such as is illustrated in FIG. 1, the intense electrical field at the base 8 of the metal foil label 2 caused paper to brown and char. Surprisingly, the intense electrical field also caused crystallized polyester terephthalate ("CPET"), which is normally considered to be a high heat stability plastic, to melt. Phenolic, a material that normally remains intact to 1000° F., decomposed in the presence of the metal foil 2 during microwave heating. When foil shielding 2 and 2' was not used on the container 3 during microwave heating, none of these materials had a significant heating rate compared to food.

The effect of electrical field strength in a microwave oven that is "loaded" with a food to be heated can be calculated from the rate of temperature rise of the food. The relevant relationship may be expressed as:

$$\frac{dT}{dt} = \frac{\omega\, E_o\, E''\, E_{rms}^2}{\rho\, C_p}$$

where $\omega$ is the angular frequency in radians per second, $E_o$ is the dielectric constant of free space, $E''$ is the dielectric loss factor of the material that is being heated, $E_{rms}$ is the root mean square electrical field strength of the microwave energy heating the material, $C_p$ is the heat capacity of the material, and $\rho$ is the density of the material. In this case, dT represents the change in temperature, and dt represents the microwave heating time. The ratio of dT/dt is the rate of heating. The term "dielectric loss factor", represented by the symbol $E''$, will be understood by those skilled in the art to be expressed relative to the dielectric of free space. $E_{rms}$ can be measured using the present invention.

Table I lists relevant properties of six materials which were evaluated for possible use as material for the container 3. $E'$ represents the dielectric constant of the material. $E''$ represents the dielectric loss factor of the material. $C_p$ is the heat capacity of the material, and $\rho$ is the density of the material. The melting temperature, or decomposition temperature, is also listed where applicable. The information for Table I was taken, in part, from *Plastics Materials & Processes*, by Seymour S. Schwartz and Sidney H. Goodman (1982), published by Van Nostrand Reinhold Co.

TABLE I

| MATERIAL TESTED | | | | | |
|---|---|---|---|---|---|
| | $E'$ | $E''$ | $C_p$ cal/g °C. | $\rho$ g/cc | Melting °C. | Decomposition |
| H.D. Polyethylene | 2.2 | 0.0013 | 0.5 | 0.92 | 115 | |
| Polypropylene | 2.2 | 0.0011 | 0.5 | 0.9 | 176 | |
| CPET | 3.0 | 0.015 | 0.5 | 1.0 | 235 | |
| Polystyrene | 2.5 | 0.00083 | 0.32 | 1.07 | 100 | |
| Phenolic Resin | 3.5 | 0.148 | 0.4 | 1.1 | | 540° C. |
| Paper | 2.7 | 0.15 | 0.5 | 0.3 | | 200–250° C. |

In Table I, the density for polypropylene was rounded to 0.9 g/cc. The density actually used was 0.899 g/cc.

Although the melting temperature for CPET is relatively high, and the decomposition temperature for paper and phenolic resin are relatively high, it has surprisingly been found that polypropylene and high density polyethylene are especially preferred materials for the composition of the container 3, particularly in the area near the edge 8 of the shield 2, while phenolic resin, paper and CPET are unsuitable.

Using the properties of the packaging materials listed in Table I, the above equation was used to calculate the theoretical heating rate of these materials in a microwave oven. The electrical field strength $E_{rms}$ was first experimentally determined by measuring the heating rate of 200 grams of water in a 700 watt microwave. The equation was then solved for $E_{rms}$, and the field strength calculated to be 12 volts per centimeter, plus or minus 1.4 volts per centimeter. At a given power input, the average electric field strength $E_{rms}$ will depend upon, and be a function of, the particular load which is placed in the oven. In a heavily loaded oven, the electric field strength would be lower. Using this value for $E_{rms}$, Equation 1 was used to calculate the theoretical temperature rise for the packaging materials listed in Table I. The results of these calculations are set forth in Table II. None of the listed materials had a temperature rise that is close to the heating rate of water. Moreover, none of the materials would appear to come close to the failing temperature of the material. The terms "failing temperature" or "failure temperature" are used herein to refer to the melting temperature, if the material 3 is a material that melts, or the decomposition temperature, if the material 3 is a material that decomposes. "Failure temperature" also includes the temperature at which any undesirable change occurs in the package material 3, such as deformation, discoloration, charring, detrimental outgassing, or detrimental softening.

TABLE II

| PREDICTED TEMPERATURE RISE | |
| --- | --- |
| | Temperature Rise °C./sec |
| Water | 0.559 |
| H.D. Polyethylene | 0.00013 |
| Polypropylene | 0.00020 |
| CPET | 0.00139 |
| Polystyrene | 0.00013 |
| Phenolics | 0.0156 |
| Paper | 0.0467 |

Of course, the actual temperature rise may depend upon changes in dielectric loss which may occur during heating, and changes in Erms which may occur.

An experiment was performed in the same 700 watt microwave oven with samples of packaging materials placed two inches from the center of the oven. Two hundred milliliters of water were placed at the center of the oven to provide a "load" for the oven. Temperatures in the oven were measured with a Luxtron fluoroptic thermometry system, Model 750. Initial rates of temperature rise were calculated by linear regression for the first ten seconds of heating, where measurements were taken every second, in order to avoid cooling effects of conduction or convection. A Luxtron probe was taped to a small sample of the material being studied which was placed in the microwave oven with the water load. Heating rates were measured and electrical field strengths were calculated.

The electrical field strengths which were determined in this manner are listed in Table III. None of the heating rates observed would raise a concern of failure of the material during a typical heating period in a microwave oven.

TABLE III

| OBSERVED HEATING RATES | | |
| --- | --- | --- |
| | Temperature Rise °C./sec | Erms V/M |
| Water | 0.572 | 1,200 |
| H.D. Polyethylene | 0.0878 | 30,992 |
| Polypropylene | 0.078 | 23,410 |
| CPET | 0.1245 | 11,327 |
| Phenolics | 0.38 | 5,909 |
| Paper | 1.069 | 5,748 |
| Wet Paper | 2.612 | 3,957 |

Paper, although having a high initial heating rate, quickly started to dry out and lose its lossiness. This decreased the heating rate of paper. This effect is shown more fully in FIG. 6. FIG. 6 is a graph illustrating the heating rate of wet paper as compared with the heating rate of water. Although wet paper initially heats very rapidly, in the experiment represented in FIG. 6, the heating rate of the wet paper rapidly levels off at about 60° C. This is shown by curve 12 in FIG. 6. Curve 13 represents the heating rate of water.

An experiment was then conducted where samples of packaging material were heated in a microwave oven with a strip of aluminum foil. A 1.5 inch long strip of foil was used. The length of the foil was slightly detuned from the length of a half wave resonant strip in order to decrease the gain slightly to facilitate measurement of initial temperature rise. The strip of foil was in contact with the sample of packaging material.

The results of this experiment are summarized in Table IV. As shown in Table IV, the heating rates were increased by 4 to 17 times the heating rate without the metal foil strip. The average gain was about 10.5. The "tuning" or "detuning" of the metal foil strip was believed to be effected by the proximity of the various materials of different dielectrics. The results of this experiment show that the heating rate of all these materials was observed to be faster than water, and faster than the heating rate of most foods. This startling result may explain why some packaging materials fail when used in combination with a metal shield 2.

TABLE IV

| EFFECT OF RESONANCE IN FOIL | | | |
| --- | --- | --- | --- |
| | HEATING RATE °C./sec | Erms KV/m | GAIN $\left(\frac{\text{HR FOIL}}{\text{HR BULK}}\right)$ |
| H.D. Polyethylene | 0.695 | 87.2 | 7.91 |
| Polypropylene | 1.355 | 97.6 | 17.37 |
| CPET | 1.611 | 40.7 | 12.94 |
| Phenolics | 1.574 | 12.0 | 4.14 |
| Paper | 7.11 | 14.8 | 6.65 |
| Wet Paper | 38.3 | 15.1 | 14.66 |

In the experiments represented in Table IV, polystyrene was excluded from the test. A small arc caused samples of polystyrene to burn. Such burning of the polystyrene risked the loss of the Luxtron probes used in the experiment.

Based on these observed heating rates, the time to failure was calculated. The results of the predicted failure time based on such calculations, and the observed failure time during experimentation, are summarized in Table V. When used in conjunction with a metal foil shield 2, materials such as paper, phenolic, and CPET failed within 27 seconds or less. A microwave heating time of six minutes was determined based upon the food substance which was desired to be heated. High density polyethylene and polypropylene did not fail during the predetermined six minute microwave heating time. Heating was discontinued after six minutes.

Polystyrene also lasted longer than six minutes. Polystyrene, however, has a tendency to fail if an arc occurs. In one experiment, the occurrence of an arc resulted in a fire. In some applications, polystyrene may be an undesirable microwave packaging material for use in connection with a metal shield 2, because arcing can sometimes occur when a metal shield 2 is employed. Formulations for polystyrene may be developed which overcome such problems.

TABLE V

| PACKAGING MATERIALS TIME TO FAILURE | | | |
| --- | --- | --- | --- |
| | FAILURE TEMP °C. | PREDICTED FAILURE TIME | OBSERVED FAILURE TIME |
| H.D. Polyethylene | 115 | 551 sec. | >6 min. |
| Polypropylene | 176 | 390 sec. | >6 min. |
| CPET | 235 | 146 sec. | 27 sec. |
| Phenolic | 540 | 20.5 sec. | 27 sec. |
| Paper | 500 | 1.1 sec | 18 sec. |

TABLE V-continued

| | PACKAGING MATERIALS TIME TO FAILURE | | |
|---|---|---|---|
| | FAILURE TEMP °C. | PREDICTED FAILURE TIME | OBSERVED FAILURE TIME |
| Polystyrene | 100 | — | >6 min. |

The time to failure of the packaging materials listed in Table V generally follows the calculated results based upon experimental measurements. The actual time to failure was also believed to be a function of heat transfer rate. To some extent, the dielectric constant and/or dielectric loss factor of the material was believed to change with temperature in some cases.

It has thus been discovered that, surprisingly, high density polyethylene and polypropylene are especially preferred materials for a microwave shielded container 3. Other preferred materials include copolymers of polypropylene and polyethylene.

Copolymers of polypropylene and polyethylene are either a blend or copolymerization of polypropylene, polyethylene and EPR (an ethylene/propylene rubber formed during copolymeriation). The final product used in packaging is generally 12–14% EPR, about 2% polyethylene and the balance polypropylene. The percentage of polyethylene may be varied. As more polyethylene is added to the blended composition, impact strength increases and temperature resistance decreases. Thus, the amount of polyethylene added to the composition involves a tradeoff between impact strength and temperature resistance. For example, about 20% polyethylene is used in copolymers from which automobile parts are fashioned where impact strength is an important consideration. EPR levels of up to 21% have been used in some applications, but such large percentages of EPR are not typically utilized in food applications. A suitable copolymer that has given good results in practice is made by Himont U.S.A., Inc., under the trademark PROFAX 7531, intermediate impact propylene copolymer for food packaging.

For purposes of the present invention, copolymers of polypropylene and polyethylene oftentimes perform with equivalent results as polypropylene alone, with the exception of melting temperature. The essential characteristics of specific gravity, heat capacity and dielectric loss factor are not significantly affected in most copolymer compositions.

High density polyethylene having a specific gravity of about 0.95 or greater and a melting temperature of about 115° C. or higher is believed to give satisfactory results. A high density polyethylene having a crystallinity of about 90% or greater may give good results. A high density polyethylene having a softening temperature of about 266° F. and a density of about 0.952 to about 0.958 g/cc has been used in practice with good results.

Isotactic polypropylene having a specific gravity of about 0.90 or greater, and a melting temperature of about 149° C. or higher, is believed to give satisfactory results in practice. A melting temperature greater than or equal to 165° C. is more preferred. An isotatic polypropylene having a density of about 0.899 g/cc and a heat deflection temperature of about 78° F. at 66 psi has given good results.

The dielectric support 3 should be preferably composed of a material having a heat capacity of about 0.5 calories per gram degrees centigrade, or greater. A dielectric support 3 having a density of about 0.89 grams per cubic centimeter, or greater, is preferred.

The metal shields or conductive sheets 2 and 2' preferably are composed of aluminum. The metal shields 2 and 2' could generally be any type of conductive sheets. Any metal may be used for the shields 2 and 2' if it is a good conductor. Suitable metals include gold, silver, steel, copper and tin.

The conductive sheets 2 and 2' preferably are in contact with the support 3. As used in this context, "contact" includes examples or embodiments where the conductive sheets 2 and 2' are adhesively bonded to the container 3, even though a thin layer of adhesive may actually be interposed between the conductive sheet 2 or 2' and the container 3.

The illustrated conductive sheets 2 and 2' are uncoated. In some applications, metal foil used in a microwave oven has been coated with insulating plastics in an effort to control arcing. Such coatings tend to reduce the electrical field strength Erms which impinges upon the packaging material. Such coating techniques are relatively expensive, and are unnecessary using the present application.

Although high density polyethylene is preferred as a packaging material, in some applications medium density polyethylene or low density polyethylene will give satisfactory results. Linear low density polyethylene may give useful results in some applications. In general, polyethylene is considered to be a suitable packaging material for many applications. Table VI below lists the properties for polyethylene in terms of density, melting temperature, and percent crystallinity:

TABLE VI

| | ρ g/cc | $T_m$ °C. | % Crystallinity |
|---|---|---|---|
| Polypropylene | .89–.92 | 149–180 | 50–70% |
| Linear low density polyethylene | .91–.93 | 120–130 | 35–45% |
| Low density polyethylene | .91–.927 | 105–115 | 40–65% |
| Medium density polyethylene | .928–.94 | 115–127 | 55–75% |
| High density polyethylene | .94–.97 | 127–138 | 65–90% |

In summary, packaging materials normally have an insignificant rate of heating in a microwave oven as compared to the heating rate of food. However, it has been discovered that the addition of metal foil shielding 2 to a microwave package 1 can intensify the electrical field at the edges 8 of the foil shield 2 by as much as 50 times the average field strength. In view of this gain in the electrical field strength, selecting a packaging material for heat stability is an insufficient basis for making a selection. A low microwave loss factor has been discovered to be a necessary requirement when a dielectric container 3 includes metal shielding 2.

The time to failure of packaging materials may be expressed as:

$$t_f = \frac{(T_f - T_i) \rho C_p}{\omega E_o E''(Erms)^2}$$

where $t_f$ is the time to failure for the packaging material, measured in seconds. $T_f$ is the failure temperature in degrees centigrade for the packaging material. For most materials, this is the melting temperature. For some materials, it is the decomposition temperature. $T_i$ is the initial package temperature, expressed in degrees centigrade. $\rho$ is the density of the packaging material, expressed in kilograms per cubic meter. $C_p$ is the heat capacity of the packaging material, expressed in joules per kilogram degree centigrade. Eo is the dielectric constant of free space, which is equal to about $8.8 \times 10^{-12}$ farads per meter. $\omega$ is the angular frequency of electromagnetic radiation, which is the case of a typical microwave oven is $2\pi \times 2.45 \times 10^9$ per second. E″ is the dielectric loss factor of the packaging material. Erms is the root means square electric field strength, expressed in volts per meter, which is applied to the packaging material. Erms is the local field intensity measured at, or as near as possible to the edge 8 of the shield 2. Erms can be measured in accordance with the present invention using a probe, such as shown in FIG. 10.

Using the above relationship for time to failure, packaging materials may be evaluated to determine whether they will be suitable when subjected to the high Erms electric fields which may result when metal shielding is used in a microwave oven. The packaging material is selected so that the heating of the dielectric packaging material is such that the period of time necessary to properly heat the food substance which is to be heated is less than the time to failure. A suitable packaging material is selected which has a combination of density, heat capacity, and dielectric loss factor so that the time to failure will not be less than the necessary heating time for the food which is to be heated in a microwave oven.

By measuring the electrical gain of a shielded package 1, the microwave heating time before failure of the container 3 can be calculated. High density polyethylene and polypropylene have been discovered to be good materials for the dielectric container 3. These materials have both a high heat stability and a low dielectric loss factor. CPET, which has a higher heat stability, will actually reach its melting point faster because it has a higher dielectric loss factor. Even though paper has a very high decomposition temperature, paper will brown or even char at the edges 8 of the foil shield 2 because its loss factor is orders of magnitude higher than most other packaging materials.

A good packaging material is determined by a combination of material characteristics. One factor may be varied, and a second factor may also be simultaneously varied, so that the two factors equally offset each other. The net result would be two different packaging materials which were equivalent for purposes of this application. For example, a good packaging material depends on a combination of density, heat capacity, and dielectric loss factor. The density could be reduced, and the dielectric loss factor could be simultaneously reduced by an equal factor or a proportionate amount, to result in an equivalent packaging material. Similarly, the heat capacity could be reduced, and the density could be increased by an amount so that the product of the two was the same, to yield equivalent results. What is important is the ratio of the dielectric loss factor divided by the product of the heat capacity times the density. Any combination of these three factors which yields an identical answer should produce equivalent results.

FIG. 7 is a graph which shows a contour plot for voltage gain as a function of thickness and dielectric properties of the packaging material. These contour plots illustrate the effect of dielectric loss and material thickness on voltage gain. FIG. 7 shows that gain generally increases as dielectric loss factor decreases.

FIG. 8 is a graph showing contour plots for temperature gain as a function of thickness and dielectric properties of the packaging material. The information graphed in FIG. 8 was measured with an infrared camera.

The rate of temperature rise may be expressed as follows:

$$\frac{\Delta T}{\Delta t} = \frac{\omega \, Eo \, E'' Erms^2}{C_p \, \rho}$$

As E″ increases, voltage gain, and therefore Erms$^2$, decreases as shown in the curves plotted in FIG. 8. The two factors, E″ and Erms$^2$, work against each other. A maximum occurs at some value for E″, for a given heat capacity and density.

Using the time to failure calculation, set forth below, it is useful to examine several examples:

$$t_f = \frac{(T_f - T_i) \, \rho \, C_p}{\omega \, Eo \, E''(Erms)^2}$$

In this example, the angular frequency $\omega$ was equal to $2\pi \times 2.45 \times 10^9$ cycles per second. The dielectric of free space Eo was equal to $8.8 \times 10^{-12}$ farads per meter. In this example, a packaging material will fail if the time to failure $t_f$ is less than the product preparation time required in order to properly heat or cook the particular food product in a microwave oven.

A more preferred criteria for selecting a suitable package material is that the dielectric container 3 should not heat more than the food substance 5, 6 or 7 within the container 3. The temperature rise in the packaging material 3 may be measured using a Luxtron temperature probe. Alternatively, for purposes of this criteria, the temperature rise in the package material 3 may be calculated as follows:

$$\Delta T_p = \frac{\Delta t \, \omega \, Eo \, E_p'' Erms^2}{\rho_p \, (C_p)_p}$$

where $\Delta T_p$ is the temperature rise in the package material or container 3; $\Delta t$ is the heating time for the food product in seconds; Erms is the maximum local electrical field strength, typically at the edge 8 of the shield 2; $\rho_p$ is the density of the package material 3; $(C_p)_p$ is the heat capacity of the package material 3; and, $E_p''$ is the dielectric loss factor for the package material 3.

The temperature rise in each food substance 5, 6 or 7 may be measured using a Luxtron temperature probe.

The temperature rise in each food substance 5, 6 or 7 may also be separately calculated. In microwave food package systems which employ multiple food substances, the temperature rise in each food substance may be calculated using techniques disclosed in application Ser. No. 922,573, filed Oct. 23, 1986, by John R. Weimer, entitled "Food Product and Method of Manufacture", which is incorporated herein by reference. For purposes of the present application, a simplified approach may be effectively utilized. For purposes of the present application, the food substance which heats the most is of primary interest, and may be used for purposes of this criteria in selecting a suitable package material. Thus, only the temperature rise in the food substance 7 which is heated the most need be considered for purposes of this criteria. In many applications, only one food substance 7 will be desired to be heated.

For purposes of this criteria, the temperature rise of the food substance 7 may be calculated from the following equation:

$$\Delta T_F = \frac{\Delta t \; \omega \; Eo \; E_F''(Erms')^2}{\rho_F \; (C_p)_F}$$

where $\Delta T_F$ is the temperature rise of the food substance 7; $\Delta t$ is the heating time for the food, expressed in seconds; $E_F''$ is the dielectric loss factor for the food substance 7; $\rho_F$ is the density of the food substance 7; $(C_p)_F$ is the heat capacity for the food substance 7; $Erms'$ is the local electrical field strength within the food substance 7. The average electrical field strength is utilized in this calculation.

Thus, in order to meet the preferred criteria that the package material 3 does not heat more than the food substance 7, the temperature rise in both the package 3 material and the food substance 7 may be calculated. The temperature rise in the package $\Delta T_p$ should not be greater than the temperature rise $\Delta T_F$ in the food substance 7.

An additional criteria for selecting an even more preferred packaging material may be based upon selecting a package material 3 which does not exceed a maximum temperature of 60° C. during the heating time $\Delta t$ utilized to heat the food substance 7.

As an illustrative example, a one minute heating time is used as a typical time for heating a food substance ($\Delta t = 60$ seconds). The following values for a brownie food substance are utilized in the above equation: $\rho_F = 400$ kilograms per cubic meter; $(C_p)_F = 1256$ J/kg°C.; $E''_F = 0.5$. In this example, using a 700 watt microwave oven, an electrical field strength Erms of 3000 volts per meter is present. Substituting these values into the above equation, a temperature rise of about 72.7° C. results. Thus, starting from an ambient temperature of about 21° C., the brownie food substance 7 reaches a maximum temperature of about 93.7° C. during this one minute heating time.

In this example, a preferable container material 3 should be selected so that the package 3 does not have a temperature rise greater than the temperature rise of the food substance 7. Preferably, the package material should not rise more than 72.7° C. for a one minute heating time. (Of course, it is also necessary that the packaging material 3 not exceed its failure temperature during this time.)

The above-described principles may also be used, in connection with the relationships described below, to determine the maximum gain of the shield 2 which is permissible based upon the criteria used for selecting a suitable packaging material 3. That is, the maximum gain may be determined to avoid failure of the packaging material 3, or alternatively, the maximum gain may be determined for a preferred packaging material 3 which does not heat faster than the food product. As an illustrative example, the equation below may be used to calculate Erms for a package using CPET to determine maximum allowable gain which would comply with each of the three criteria discussed above:

$$Erms = \sqrt{\frac{\Delta T \; \rho_p \; (C_p)_p}{\omega \; Eo \; E_p'' \; \Delta t}}$$

Using the equation for calculating the electrical field strength Erms, discussed above, the maximum field strength in order to satisfy the above three criteria may be calculated. First, the maximum field strength which may be reached to prevent failure of the packaging material 3 may be calculated. Second, the maximum field strength to ensure that the package material 3 remains cooler than the food substance 7 may be determined for a preferred packaging material. Finally, the maximum electrical field strength for an even more preferred packaging material 3 which does not exceed 60° C. may also be calculated.

Taking the example of cooking a brownie 7, a low load food item, using a package material 3 composed of CPET, the maximum Erms may be calculated as follows, where $\Delta T_p = \Delta T_F$:

$$Erms = \sqrt{\frac{\Delta T_p \; \rho_p \; (C_p)_p}{\Delta t \; \omega \; Eo \; E_p''}}$$

$$Erms = \sqrt{\frac{72.7 \times 1,000 \times 0.5 \times 4186}{60 \times 2\pi \times 2.45 \times 10^9 \times 8.8 \times 10^{-12} \times 0.015}}$$

$$Erms = 35,336 \text{ volts per meter}$$

In this example, the electrical field strength Erms may be measured for an identical package 1 which does not have a shield 2. If the measured Erms is 3000 volts per meter, then the gain may be calculated as follows:

Gain = 35,336 ÷ 3,000 = 11.8

Thus, for a food container 3 composed of CPET, the gain in electrical field strength at the edge 8 of the shield 2 cannot exceed 11.8 if the package material 3 is not to reach a temperature hotter than the brownie 7.

A less preferred condition, but a necessary condition, is that the package material 3 be selected so that the package material 3 does not reach a temperature sufficient to melt the package material 3. In the case of CPET, the melting point or failure temperature $T_f$ equals 235° C. Thus, the temperature rise for the package material 3 may be calculated as follows, assuming an initial temperature $T_i$ of 21° C.:

$\Delta T_p = T_f - T_i$ $\Delta T_p = 235°$ C. $- 21°$ C.

$\Delta T_p = 214°$ C.

Using the above value for $\Delta T_p = 214°$ C., the value of the electrical field Erms may be calculated. In this example, the Erms value which will cause melting of the CPET is 60,627 volts per meter. Thus, a container 3 composed of CPET will fail in this example if the gain is greater than 20.2.

In an even preferred case, the package 3 should not exceed a temperature of 60° C. during the heating time $\Delta t$. In this example, utilizing a CPET container 3 and a brownie food substance 7, the temperature rise of the package $\Delta T_p = 60°$ C. $- T_i = 60°$ C. $- 21°$ C. $= 39°$ C. Thus, the maximum electrical field strength Erms may be calculated. In this case, Erms equals 25,800 volts per meter. The gain in the electrical field strength due to the presence of the shield 2 may not be greater than 8.6 for this more preferred region of operation.

In this example, a comparison is made between polyethylene and the CPET container 3 used in the above example. Using the same gain which was calculated above, it is possible to calculate the temperature rise for a container 3 composed of polyethylene. In the case of polyethylene, for a gain equal to 11.8, the temperature rise ΔT equals 7° C. Thus, all other things being equal, a container 3 composed of polyethylene would only reach a temperature of about 28° C., assuming an initial temperature of 21° C. Similarly, for a gain equal to 20, the temperature rise ΔT equals 20.6° C. for polyethylene. In such an example, a container 3 composed of polyethylene would meet the most preferred condition, i.e., the container 3 would be cooler than 60° C.

Similarly, in the above example where the gain equals 11.8, for polypropylene ΔT equals 5.9° C. Where the gain equals 20, for polypropylene the temperature rise ΔT equals 17° C. Similarly, polypropylene would meet the most preferred condition, i.e., the package material 3 would remain cooler than 60° C.

Using the above analysis, one can also determine the gain required to make polyethylene fail. Using a melting or failure temperature of 115° C., the gain must equal 43.6 in order for polyethylene to fail. One can also calculate the maximum gain for a preferred package which does not become hotter than the food product. The maximum permissible gain for polyethylene to still attain this preferred condition is 38.4.

Another useful example of a container 3 composed of CPET may be considered for purposes of illustration. If we assume a microwave oven having a power rating of about 700 watts, with average field of about 30 volts per centimeter, we may calculate the electric field strength Erms, and the gain, which would cause the container 3 to melt. In this example, we assume the following food characteristics: 5 minute heating time Δt, specific gravity $\rho_F = 1$, heat capacity $(C_p)_F = 1.0$, and a dielectric loss $E_F'' = 1$. These food characteristics would result in a final temperature for the food equal to 100° C., assuming an initial temperature of 21° C.

For CPET, the electric field strength Erms which would cause a failure of the CPET material, may be calculated where $\Delta T = 235°$ C. $-21°$ C. $= 214°$ C. Substituting in the appropriate one of the above-discussed equations, Erms may be calculated as follows:

$$Erms = \sqrt{\frac{214 \times 1.0 \times 1,000 \times 0.5 \times 4186}{300 \times 2\pi \times 2.45 \times 10^9 \times 8.8 \times 10^{-12} \times 0.015}}$$

$$Erms = 27,113$$

Where the average value of the electric field strength is 3000 volts per meter without the conductive shield 2, the gain in this example would equal 9.

FIG. 9 is a graph depicting gain versus the dielectric loss factor for an example of a food and package combination. FIG. 9 used an example which employed typical ranges for heat capacity, specific gravity, and microwave heating time. The vertical axis shows $\log_{10}(E'')$.

The values taken from the above example may then be compared with the example plotted in the graph of FIG. 9. In the above example, E'' equals 0.015. In order to relate this value to the graph of FIG. 9, we must calculate the logarithmic value (base 10) for E''. In this case, $\log_{10} E''$ equals $-1.82$. A value for E'' of $-1.82$, results in a gain value equal to about 9. This agrees closely with the gain value plotted in FIG. 9 which corresponds to a dielectric loss factor $\log_{10} E'' = -1.82$. The slight differences which may be observed result because FIG. 9 assumes a package material having a 200° C. melting temperature. The melting temperature for CPET is 235° C.

FIG. 9 illustrates the general relationship between dielectric loss factor E'' and again. For any given example, the actual oven, food and package characteristics may be used to produce a graph which accurately reflects the characteristics for that particular example. For any given packaging material, however, a graph similar to that shown in FIG. 9 may be plotted to determine the acceptable gain for the three given criteria for selecting a packaging material for the container 3.

Thus, for any given example, a graph such as shown in FIG. 9 may be plotted where curve 17 represents the maximum gain for any given dielectric loss factor which would result in failure of the container 3. Curve 18 represents the maximum gain permissible, as a function of dielectric loss factor, to maintain the container 3 at a temperature less than the food 7. Curve 19 represents the maximum gain, as a function of dielectric loss factor E'', necessary to maintain the temperature of the container 3 less than 60° C.

Curve 20, and the regions to the left of curve 20 in FIG. 9, represents a region of operation where package failure is unlikely to occur regardless of the material selected for the container 3, due to the low gain.

The present application involves nonarcing packages or containers 3, 4 for heating food in a microwave oven. By "nonarcing" it is meant that the package does not intrinsically arc itself, e.g., result in arc discharges from one package component to another or to the food or to the floor of the oven. A "nonarcing" package can sometimes be made to arc if placed too closely to metallic oven components other than the floor of the oven or adjacent food packages. Arcs which result in that manner are not considered for purposes of defining an "intrinsically nonarcing" package. In other words, an "intrinsically nonarcing" package can be made to arc if it is brought to closely to metallic oven components or to another package.

In some applications, instead of merely selecting a suitable packaging material 3 which meets one of the three criteria discussed above, it may be desirable to also adjust the gain of the microwave package 1. The gain resulting from metal components may be adjusted, for example, by changing the dimensions of the metal sheet 2. In some instances, the geometry of the metal components may be changed, such as by providing overlapping edges. Other techniques for adjusting the gain of the package are disclosed in application Ser. No. 922,287, filed Oct. 23, 1986.

In utilizing a conductive sheet or shield 2 to modify the heating of foods in a microwave oven, the tolerance and reproducibility of the heating effects upon the food are an important consideration. Tolerance and reproducibility of results depends significantly upon the dimensional stability of the container 3 and shield configuration. This may be broken down into two considerations: first the shield 2 must remain dimensionally stable during microwave heating in order to maintain a consistent modification of electric field, or else reproducibility of microwave heating effects on the food will be difficult; and, second the food containing cavity defined by the container 3, 4 must be dimensionally stable and essentially rigid. A variation in the configuration of the food containing cavity may affect the reproducibility and consistency of the heating effects upon the food from one package to another.

In the present application, a rigid, dimensionally stable dielectric container 3 is preferred. The container 3 supports the conductive sheet 2, which is wrapped around the container 3. Thus, the dimensional stability of the conductive sheet 2 is also maintained by the rigidity of the container 3. These factors are important for consistent microwave performance where microwave packages are mass-produced for use in various consumer microwave ovens, whose characteristics may vary widely. By "dimensionally stable", it is meant that the dielectric support/conductive sheet configuration does not change shape during microwave heating, for example, does not shrink or expand. Normally, the dielectric support/conductive sheet configuration should have the same shape from one package to another.

The present application is particularly concerned with package materials 3 which are formed from organic compounds, i.e., compounds containing carbon atoms. Organic compounds are more likely to be affected adversely by undue levels of microwave heating when exposed to relatively high electric field strengths resulting from gain due to conductive elements in the microwave package 1.

The present application is also particularly concerned with microwave environments of the type encountered in microwave ovens. The selection of suitable dielectric materials 3 for packages 1 which may only be exposed to extremely low field strength levels is not critical. The present application is particularly applicable in microwave environments where the average electric field strength Erms is greater than 1 v/cm. In a typical application involving the present application, the package 1 is designed to survive microwave radiation in the enclosed cavity of a microwave oven having a power input of at least 10 watts, more typically in excess of 400 watts.

In particular, the present application is concerned with microwave packaging systems where the food material involved presents a low load to the microwave oven. At a given power input, the average electric field strength Erms will depend upon the particular load which is placed in the microwave oven. In a heavily loaded oven, the electric field strength will be lower. In a food package using a heavy load such as a meat roast, the oven will be so heavily loaded that the electric field strength Erms will be so low as to virtually eliminate the possibility of causing the packaging material to exceed its failure temperature. Thus, the present application is applicable for food materials which present a low load to the microwave oven, because in such instances, the electric field strength Erms can reach sufficiently high levels to cause the packaging material to fail if it is not properly selected in accordance with the present application.

As used herein, the term "low load" means that the average electric field strength in the immediately vicinity of the package or food can reach 10 volts per centimeter or greater. This condition may be shown to be satisfied by using two measurement techniques.

First, a Luxtron probe assembly 21 as illustrated in FIG. 10 may be used to measure the electric field strength in the immediate vicinity of the package 1. In making such a measurement, it is important to measure the average electric field strength around the package by taking measurements at several locations spaced approximately ½ inch to 1 inch from the surface of the package 1. In some instances, reflections from metal components 2 in the package 1 may be produced spurious readings.

Second, the temperature rise ΔT in the food may be measured using a Luxtron temperature probe. The density $\rho$, heat capacity $C_p$ and dielectric loss factor $E''$ for the food may also be measured. Of course, the microwave heating time $\Delta t$ is also known, as well as the angular frequency $\omega$ of the microwave radiation and the dielectric constant of free space Eo. These values may be substituted into the equation for calculating Erms as follows:

$$Erms = \sqrt{\frac{\Delta T \rho (C_p)}{\Delta t \, \omega \, Eo \, E''}}$$

Low loads result in an electric field strength Erms of 10 volts per centimeter or greater. It is such high field strengths which cause problems with the failure of packaging materials.

A low load food product may result from two different factors. First, the food may be a low loss food, i.e., the dielectric loss factor $E''$ for the food may be a relatively low value. Second, even relatively lossy foods may constitute a low load where only small amounts of the food are present in the microwave oven. For example, quantities of food less than 200 grams may present a low load in a microwave oven even if the food has a relatively high dielectric loss factor $E''$.

In applications where food is cooked in the package 1, the temperature of the food will typically be elevated to 100° C. or greater. In applications where the food is reheated, the temperature of the food will typically be elevated to 60° C. or greater. Other applications may include thawing frozen food. Although some thawing applications may not involve a significant elevation of the food temperature, the package 1 is exposed to a significant level of microwave radiation for purposes of thawing the food, which does involve an appreciable amount of energy transfer as latent heat in order to change the state of water molecules in the food. Other applications may involve warming frozen food to room temperature, which typically involves a change of food temperature from about 0° C. or less to about 21° C.

The present application is particularly applicable where conductive members 2 in a package 1 result in a gain. For purposes of the present application, susceptor material is not considered to be conductive. It is believed that gain within the meaning of the present application does not result for susceptor members or sheets having a resistivity greater than 10 ohms per square. For purposes of the present application, a conductive sheet member or element 2 means a conductive material which has a resistivity of less than 1 ohms per square, more preferably less than 0.1 ohm per square. For purposes of the present application, a conductive material is a material in which a relatively large current flows when a potential is applied between two points on or in a body constructed from the material. Metal foil is considered to be conductive material for purposes of this application. Typical metal foil thicknesses range between 0.000275 inch and 0.006 inch.

The above disclosure has been directed to a preferred embodiment of the present invention. The invention may be embodied in a number of alternative embodiments other than those illustrated and described above. A person skilled in the art will be able to conceive of a number of modifications to the above described embodiments after having the benefit of the above disclosure and having the benefit of the teachings herein. The full scope of the invention shall be determined by a proper interpretation of the claims, and shall not be unnecessarily limited to the specific embodiments described above.

What is claimed is:

1. A method for measuring strong microwave electric field strengths, comprising the steps of:
   heating a susceptor means with microwave radiation, where the susceptor means is located at a first location whose electric field strength is desired to be determined;
   measuring a temperature indicative of the heating effects of microwave radiation at the first location;
   measuring an ambient temperature at a second location remote from the first location;
   determining a temperature differential representative of the difference between the first temperature and the ambient temperature; and,
   determining the electric field strength at the first location based upon the magnitude of the temperature differential.

2. The method according to claim 1, further comprising the step of:
   calibrating the relationship between the temperature differential and electric field strength by measuring the magnitude of the temperature differential in a known electric field.

3. An apparatus for measuring strong microwave electric field strength, comprising:
   a first temperature probe for measuring a temperature indicative of the heating effects of microwave radiation at a first location whose electric field strength is desired to be determined;
   susceptor means secured to the first temperature probe, the susceptor means being operative to heat responsive to strong microwave radiation;
   a second temperature probe located remote from the first probe for measuring an ambient temperature at a second location remote from the first location;
   means for determining a temperature differential representative of the difference between the first temperature and the ambient temperature; and,
   calibration means for relating said temperature differential to electric field strength at the first location.

4. The apparatus according to claim 3, wherein:
   the susceptor means comprises a polyester substrate having a stainless steel coating.

5. A method for selecting packaging material for use in a shielded microwave container having a gain greater than 3, comprising the steps of:
   measuring the average electric field strength E'rms in the proximity of package material of a microwave food package without a shield by:
      heating a susceptor means with microwave radiation, where the susceptor means is located at a first location proximate to the package material;
      measuring a temperature indicative of the heating effects of microwave radiation at the first location;
      measuring an ambient temperature at a second location remote from the first location;
      determining a temperature differential representative of the difference between the first temperature and the ambient temperature; and,
      determining the electric field strength at the first location based upon the magnitude of the temperature differential;
   measuring the maximum electric field strength Erms in the proximity of the shield for the microwave food package with the shield by:
      heating a susceptor means with microwave radiation, where the susceptor means is located at the first location proximate to the shield;
      measuring a temperature indicative of the heating effects of microwave radiation at the first location;
      measuring an ambient temperature at the second location remote from the first location;
      determining a temperature differential representative of the difference between the first temperature and the ambient temperature; and,
      determining the electric field strength at the first location based upon the magnitude of the temperature differential;
   calculating the gain = Erms/E'rms;
   selecting a package material having a dielectric loss factor E'' less than 0.1;
   further selecting a package material having a combination of dielectric loss factor E'', heat capacity $C_p$, density $\rho$ and failure temperature $T_f$, such that during microwave heating for a predetermined microwave heating time $\Delta t$ dependent upon the food substance to be heated in the food package:

$$\Delta t < \frac{(T_f - T_i)\, \rho\, C_p}{\omega\, Eo\, E''\, (Erms)^2}$$

where $T_i$ is the initial temperature of the package material, $\omega$ is the angular frequency of the microwave oven, Eo is the dielectric constant of free space, and Erms is the maximum electric field strength to which the package material is subjected during microwave heating; and,
   constructing a microwave food package having a gain greater than 3 and where the shield is spaced from the selected package material less than 0.1 inch.

* * * * *

UNITED STATES PATENT AND TRADEMARK OFFICE
CERTIFICATE OF CORRECTION

PATENT NO. : 4,816,634
DATED : March 28, 1989
INVENTOR(S) : Ronald R. Lentz et al.

It is certified that error appears in the above—identified patent and that said Letters Patent is hereby corrected as shown below:

Column 1, line 15, change "and Method for Manufacture" to -- for Microwave Heating and Method of Substantially Eliminating Arcing in a Microwave Food Container --.

Column 3, line 31, change "polymer" to -- polyester --.

Column 5, line 7, change "39" to -- 30 --; line 33, change "26" to -- 25 --.

Column 6, line 45, change "field" to -- foil --; line 48, change "where" to -- were --; line 60, change "0.5" to -- 0.05 --.

Column 9, line 64, change "levels" to -- leveled --.

Column 11, line 24, change "copolymeriation" to -- copolymerization --; line 62, change "isotatic" to -- isotactic --.

Column 13, line 6, change "is" to -- in --.

Column 16, line 57, after "even" insert -- more --; line 63, change "25,800" to -- 25,880 --.

Column 18, line 4, change "again" to -- gain --; line 39, change "brought to" to -- brought too --.

UNITED STATES PATENT AND TRADEMARK OFFICE
CERTIFICATE OF CORRECTION

PATENT NO. :   4,816,634
DATED      :   March 28, 1989
INVENTOR(S):   Ronald R. Lentz et al.

It is certified that error appears in the above—identified patent and that said Letters Patent is hereby corrected as shown below:

Column 19, line 57, change "immediately" to -- immediate --.

Column 20, line 1, change "be produced" to -- produce --; line 54, change "ohms" to -- ohm --.

Signed and Sealed this

Seventeenth Day of October, 1989

Attest:

DONALD J. QUIGG

Attesting Officer        Commissioner of Patents and Trademarks